(12) United States Patent
Jang

(10) Patent No.: US 7,315,174 B2
(45) Date of Patent: Jan. 1, 2008

(54) METHOD OF MEASURING FLAT-BAND STATUS CAPACITANCE OF A GATE OXIDE IN A MOS TRANSISTOR DEVICE

(75) Inventor: Chang Soo Jang, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/646,515

(22) Filed: Dec. 28, 2006

(65) Prior Publication Data

US 2007/0164758 A1   Jul. 19, 2007

(30) Foreign Application Priority Data

Dec. 29, 2005   (KR) .................. 10-2005-0133222

(51) Int. Cl.
*G01R 27/26*   (2006.01)
*G01R 31/26*   (2006.01)
*G01B 7/02*   (2006.01)

(52) U.S. Cl. .............. 324/671; 324/769; 702/170
(58) Field of Classification Search .......... 324/671, 324/663, 658, 649, 600, 765, 769, 686, 662; 702/167, 170; 438/14, 17
See application file for complete search history.

(56) References Cited

U.S. PATENT DOCUMENTS

| | | | | |
|---|---|---|---|---|
| 4,860,229 A | * | 8/1989 | Abbe et al. .............. | 702/167 |
| 5,525,822 A | * | 6/1996 | Vinal ....................... | 257/344 |
| 6,456,082 B2 | * | 9/2002 | Nowak et al. ............ | 324/458 |
| 6,456,105 B1 | * | 9/2002 | Tao .......................... | 324/769 |
| 6,486,682 B1 | * | 11/2002 | Wang et al. .............. | 324/671 |
| 6,714,027 B1 | * | 3/2004 | Lui et al. .................. | 324/719 |
| 6,885,214 B1 | * | 4/2005 | Su et al. ................... | 324/765 |
| 6,964,875 B1 | * | 11/2005 | En et al. ................... | 438/14 |
| 6,980,009 B2 | * | 12/2005 | Maciejewski et al. .... | 342/671 |
| 2002/0036328 A1 | * | 3/2002 | Richards et al. ......... | 257/401 |

FOREIGN PATENT DOCUMENTS

KR   10-2001-0072674   7/2001

OTHER PUBLICATIONS

Office Action from the Korean Patent Office, issued Nov. 18, 2006, in counterpart Korean Patent Application No. 10-2005-0133222.

* cited by examiner

*Primary Examiner*—Vincent Q. Nguyen
*Assistant Examiner*—Hoai-An D. Nguyen
(74) *Attorney, Agent, or Firm*—Finnegan, Henderson, Farabow, Garrett & Dunner, L.L.P.

(57) ABSTRACT

A method of measuring flat-band status capacitance of a gate oxide in a MOS transistor device is disclosed. According to the method of measuring flat-band status capacitance of gate oxide in MOS transistor device, flat-band status capacitance of gate oxide in MOS transistor device can be automatically measured and immediately analyzed by using a characteristics measuring system that changes in accordance with a gate voltage.

7 Claims, 1 Drawing Sheet

METHOD OF MEASURING FLAT-BAND STATUS CAPACITANCE OF A GATE OXIDE IN A MOS TRANSISTOR DEVICE

RELATED APPLICATION

This application is based upon and claims the benefit of priority to Korean Application No. 10-2005-0133222 filed on Dec. 29, 2005, the entire contents of which are incorporated herein by reference.

BACKGROUND

1. Technical Field

The present invention relates to a method of measuring flat-band status capacitance of a gate oxide in a MOS transistor device.

2. Discussion of Related Art

Flat-band status in a MOS transistor device structure refers to a state wherein the voltage is supplied at a gate so that the band is not bent and the charge of a spatial area is "0" in an energy band structure between a gate electrode, a gate oxide, and a channel area of a MOS transistor device.

Gate voltage for forming flat-band status is "0" in an ideal MOS transistor device structure, but the real result are different.

Flat-band status of an energy band of a MOS transistor device is determined to be flat through the measurement of a capacitance of a gate. In the related art, a method of measuring flat-band status capacitance is based on a passive measurement result.

But capacitance may not always be accurately identified and the malfunction status thereof may be tested during a semiconductor manufacturing process because the method may not be applied in a DC parametric measurement among controlled semiconductor manufacturing processes. Accordingly, there is a problem that because malfunction situations were identified through malfunction analysis only after all of the manufacturing processes were completed and the malfunction status was generated, it took a long time to cope with the malfunction situations.

BRIEF SUMMARY

Consistent with the present invention there is provided a method of measuring flat-band status capacitance of a gate oxide in a MOS transistor device that is capable of using and applying general test pattern for measuring the depth of a gate oxide regardless of designing a new measuring pattern and performing measurement and analysis operations by using an automatic measuring unit.

Consistent with the present invention there is provided a method of measuring flat-band status capacitance of a gate oxide in a MOS transistor device where analysis can be performed in a DC parametric measurement test implemented in a production step of semiconductor products if a program using control test unit of a DC parametric system is applied therefore, malfunction of wafer at an early semiconductor process can be detected.

Consistent with the present invention, there is provided a method of measuring flat-band status capacitance of gate oxide in MOS transistor device comprising, mounting a measurement object wafer in a probe station connected to a capacitance measuring unit; measuring accumulation capacitance ($C_{ox}$) of a gate oxide of the wafer using the capacitance measuring unit; measuring capacitance ($C_{meas}$) from the gate while changing a gate voltage ($V_{gs}$) of the wafer using the capacitance measuring unit; computing the thickness of a depletion layer ($W_{inv}$) using the measured accumulation capacitance ($C_{ox}$) and the measured gate capacitance ($C_{meas}$); computing bulk density (Nx) on the basis of the gate voltage ($V_{gs}$) in the case that depth of a depletion layer is 90% of a predetermined reference depth; computing debye length $L_D$ using the bulk density (Nx); and computing flat-band status capacitance using the accumulation capacitance ($C_{ox}$) of the gate oxide and the debye length $L_D$.

It is to be understood that both the foregoing general description and the following detailed description consistent with the present invention are exemplary and explanatory and are intended to provide further explanation consistent with the invention as claimed.

BRIEF DESCRIPTION OF THE DRAWINGS

The accompanying drawings, which are included to provide a further understanding consistent with the invention and are incorporated in and constitute a part of this application, illustrate embodiment(s) consistent with the invention and together with the description serve to explain the principle consistent with the invention. In the drawings.

DETAILED DESCRIPTION

Reference will now be made in detail to the preferred embodiments consistent with the present invention, examples of which are illustrated in the accompanying drawings. Wherever possible, the same reference numbers will be used throughout the drawings to refer to the same or similar parts.

Hereinafter, a method of measuring flat-band status capacitance of a gate oxide in a MOS transistor device in accordance with an exemplary embodiment consistent with the present invention will be explained with reference to the accompanying drawings.

In an explanation in accordance with an exemplary embodiment consistent with the present invention, an expression "on" means that something is formed directly on another thing or indirectly formed by intervening in another layer in case of disclosing the formation "on" respective layers.

Figure 1A:
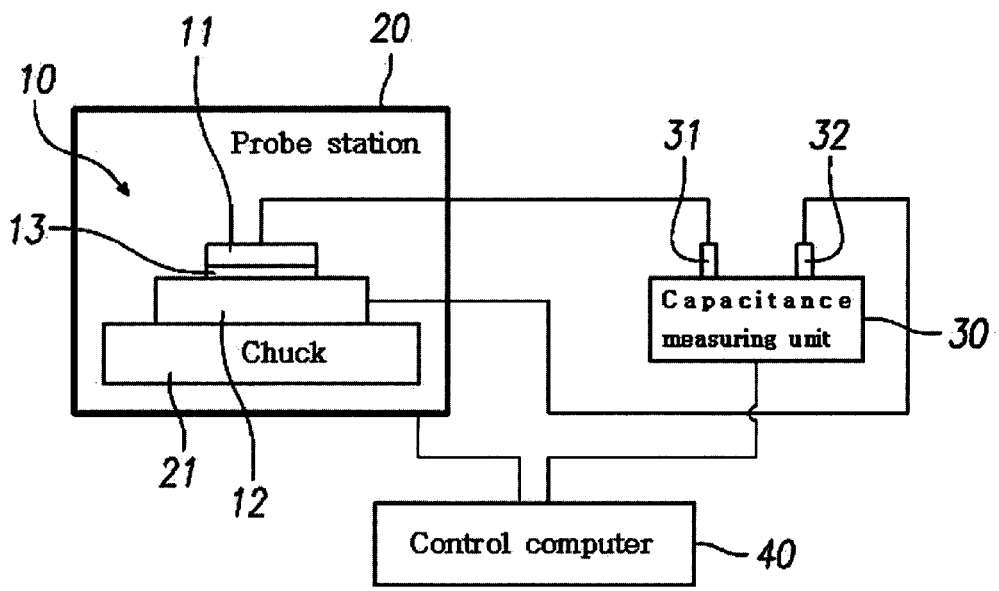
FIGS. 1a and 1b are diagrams showing a characteristic measuring system of a MOS transistor device used in a measuring method consistent with the present invention.
Figure 1B:
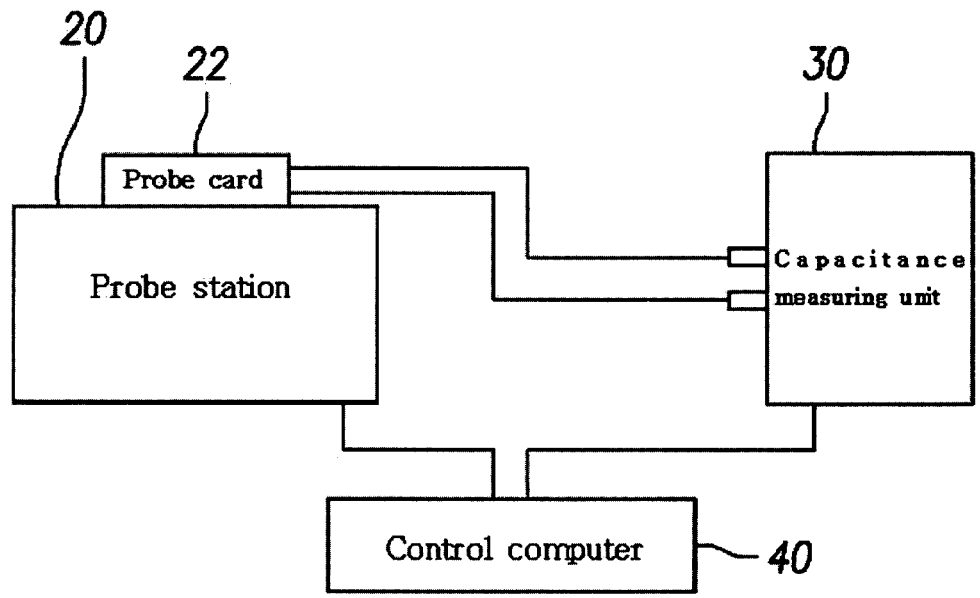

FIGS. 1a and 1b are diagrams showing a characteristic measuring system of a MOS transistor device used in a measuring method consistence with the present invention.

FIG. 1a is an example of a system for measuring carrier density distribution of a MOS transistor device using an Automatic Test System in a Manual Test System. In the case of measurement and analysis, except for mechanical operations such as loading a wafer at a Probe Station in the Manual Test System, the present invention can be applied and thus the procedure can be automated.

In addition, FIG. 1b is an example embodying a system for measuring carrier density distribution of a MOS transistor device using an Automatic Test System in an automatic DC Parametric Test System.

Referring to FIGS. 1a and 1b, a measurement object wafer 10 is positioned on a chuck 21 inside of a probe station 20. A high frequency terminal 31 of a capacitance measuring unit 30 (specifically, LCR meter) is connected to a gate 11 of wafer 10, and a low frequency terminal 32 is connected to a substrate 12 of wafer 10. Probe station 20 and capacitance measuring unit 30 are respectively connected to a control computer 40.

Probe station 20 of FIG. 1a is connected to a measuring device (not shown) using a probe, and probe station 20 of FIG. 1b uses a probe card 22.

Probe station 20 is shielded from external influences using a dark box or a shielding box in order to prevent distortion of data measured by an external light or by electromagnetic waves.

The following is a description of a method of measuring flat-band status capacitance of a gate oxide in a MOS transistor device in accordance with an exemplary embodiment consistent with the present invention.

Wafer 10 is mounted inside of probe station 20, and an electrical connection by the probe or the probe card is achieved.

A high frequency (10 KHz~1 MHz) is adjusted as a reference frequency of capacitance measuring unit 30. A gate channel area becomes in an accumulation state by DC voltage and the capacitance (Cox) of a gate oxide 13 is measured.

While changing a high frequency terminal voltage ($V_{gs}$) of the capacitance measuring unit in order to enable the gate channel area to be in an inversion state through a depletion state from an accumulation state.

Capacitance ($C_{meas}$) corresponding to gate voltages ($V_{gs}$) is measured and recorded at gate 11 while changing a high frequency terminal voltage of capacitance measuring unit 30 in order to enable the gate channel of the MOS transistor device to be an inversion state through a depletion state from an accumulation state.

Depth $W_{inv}$ of depletion layer is obtained by the measured capacitance ($C_{meas}$). The depth $W_{inv}$ of the depletion layer is computed by Equations 1 and 2.

$$\frac{1}{C_{meas}} = \frac{1}{C_{ox}} + \frac{1}{C_{siinv}} \qquad [\text{Equation 1}]$$

$$W_{inv} = A\varepsilon_{si}\varepsilon_0\left(\frac{1}{C_{meas}} - \frac{1}{C_{ox}}\right), \qquad [\text{Equation 2}]$$

In Equations 1 and 2, $C_{meas}$ denotes capacitance measured at a gate terminal regarding gate voltages, $C_{siinv}$ and $W_{inv}$ respectively denote the capacitance and the thickness of a depletion layer washed off the silicon surface by a gate voltage and $\varepsilon_{si}$ denotes relative dielectric constant of a silicon.

The doping density of substrate 12 and bulk doping density (Nx) is defined as a value measured in the case that depth of a depletion layer is 90% of a reference when maximum value of the depth of the depletion layer serves as the reference. Therefore, the bulk doping density (Nx) is computed on the basis of the gate voltage ($V_{gs}$) in the case that depth of a depletion layer is 90% of a reference.

The bulk doping density (Nx) is obtained by Equation 3.

$$N_x = \frac{-2(1 - C_q/C_{ox})/(1 - C_{meas}/C_{ox})}{A^2 q \varepsilon_{si} \varepsilon_0}\left[\text{partial}\atop{partial V_{gs}}\left(\frac{1}{C^2_{meas}}\right)\right]^{-1} \qquad [\text{Equation 3}]$$

In Equation 3, a debye length $L_D$ is computed using the computed bulk doping density (Nx).

$$L_D = (1 \times 10^4)\sqrt{\frac{\varepsilon_0 \varepsilon_{si} \times kT}{q^2 N_x}}, \qquad [\text{Equation 4}]$$

In Equation 4, kT denotes the heat energy at room temperature and q denotes the quantity of an electric charge ($1.60219 \times 10^{-19}$ C) of an electron.

Flat-band capacitance ($C_{fb}$, units in picofarads) is computed using the data. That is, it is obtained by Equation 5 using the measured accumulation capacitance ($C_{ox}$, unit of pF) of a gate oxide and the debye length $L_D$.

$$C_{fb} = \frac{C_{ox} \times \varepsilon_0 \varepsilon_{si} \times A/(1 \times 10^{-4})L_D}{(1 \times 10^{-12})C_{ox} + \varepsilon_0 \varepsilon_{si} \times A/(1 \times 10^{-4})L_D}, \qquad [\text{Equation 5}]$$

In Equation 5, A denotes an area of the gate oxide.

As described above, according to a method of measuring flat-band status capacitance of a gate oxide in a MOS transistor device, the flat-band status capacitance of a gate oxide in a MOS transistor device can be automatically measured and immediately analyzed by using a characteristic measuring system that changes in accordance with a gate voltage.

Thus, according to a method of measuring flat-band status capacitance of a gate oxide in a MOS transistor device, because carrier density distribution of a channel area can be analyzed not through physical property or chemical analysis but an electrical nondestructive inspection, embodying the measurement pattern of a MOS structure having a proper area, loss of wafer specimen can be prevented.

In addition, according to a method of measuring flat-band status capacitance of a gate oxide in a MOS transistor device consistent with the present invention, because analysis can be performed in a DC parametric measurement test implemented in a production step of semiconductor, malfunction of wafer at an early semiconductor process can be detected.

It will be apparent to those skilled in the art that various modifications may be made without departing from the spirit and scope consistent with the invention as defined by the appended claims.

What is claimed is:

1. A method of measuring flat-band status capacitance of a gate oxide in a MOS transistor device, comprising:
   mounting a measurement object wafer in a probe station connected to a capacitance measuring unit;
   measuring accumulation capacitance ($C_{ox}$) of a gate oxide of the wafer using the capacitance measuring unit;
   measuring capacitance ($C_{meas}$) from the gate while changing a gate voltage ($V_{gs}$) of the wafer using the capacitance measuring unit;
   computing the thickness of a depletion layer ($W_{inv}$) using the measured accuulation capacitance ($C_{ox}$) and the measured gate capacitance ($C_{meas}$);
   computing bulk density (Nx) on the basis of the gate voltage ($V_{gs}$) in the case that the depth of a depletion layer is 90% of a predetermined reference depth;
   computing debye length $L_D$ using the bulk density (Nx); and
   computing flat-band status capacitance using the accumulation capacitance ($C_{ox}$) of the gate oxide and the debye length $L_D$.

2. The method according to claim 1, wherein measuring accumulation capacitance ($C_{ox}$) of a gate oxide is performed by adjusting a reference frequency of the capacitance measuring unit as a high frequency and enabling a gate channel area to be in an accumulation state by DC voltage.

3. The method according to claim 1, wherein measuring capacitance ($C_{meas}$) from the gate is performed by changing a high frequency terminal voltage $V_{gs}$ of the capacitance measuring unit in order to enable the gate channel area to be in an inversion state through a depletion state from an accumulation state.

4. The method according to claim 1, wherein computing the thickness of a depletion layer ($W_{inv}$) is computed by the equation, $$\frac{1}{C_{meas}} = \frac{1}{C_{ox}} + \frac{1}{C_{siinv}} \text{ and } W_{inv} = A\varepsilon_{si}\varepsilon_0 \left(\frac{1}{C_{meas}} - \frac{1}{C_{ox}}\right),$$

wherein, $C_{siinv}$ denotes capacitance of a depletion layer washed off a surface of the wafer by a gate voltage, A denotes an area of the gate oxide, $\epsilon_{si}$ denotes relative dielectric constant of silicon, and $\epsilon_0$ denotes dielectric constant in a vacuum state.

5. The method according to claim 1, wherein computing bulk density (Nx) is computed by an equation below, $$N_x = \frac{-2(1 - C_q/C_{ox})/(1 - C_{meas}/C_{ox})}{A^2 q \varepsilon_{si} \varepsilon_0} \left[\frac{\text{partial}}{\text{partial} V_{gs}}\left(\frac{1}{C_{meas}^2}\right)\right]^{-1},$$

wherein, q denotes the quantity of electric charge ($1.60219 \times 10^{-9}$ C) of an electron and $C_q$ is a quasi-static capacitance of the gate oxide.

6. The method according to claim 1, wherein computing debye length $L_D$ is computed by an equation below, $$L_D = (1 \times 10^4)\sqrt{\frac{\varepsilon_0 \varepsilon_{si} \times kT}{q^2 N_x}},$$

wherein, kT denotes the heat energy at room temperature.

7. The method according to claim 1, wherein flat-band status capacitance is computed by the following equation below, $$C_{fb} = \frac{C_{ox} \times \varepsilon_0 \varepsilon_{si} \times A/(1 \times 10^{-4})L_D}{(1 \times 10^{-12})C_{ox} + \varepsilon_0 \varepsilon_{si} \times A/(1 \times 10^{-4})L_D},$$

wherein, A denotes an area of the gate oxide, Cox denotes accumulation capacitance of a gate oxide, $L_D$ denotes debye length, $\epsilon_{si}$ denotes relative dielectric constant of a silicon and $\epsilon_0$ denotes dielectric constant in a vacuum state.

* * * * *